US012615790B2

(12) United States Patent
Waind

(10) Patent No.: US 12,615,790 B2
(45) Date of Patent: Apr. 28, 2026

(54) REVERSE BLOCKING INSULATED-GATE BIPOLAR TRANSISTOR

(71) Applicant: Littelfuse, Inc., Chicago, IL (US)

(72) Inventor: Peter Waind, Lampertheim (DE)

(73) Assignee: Littelfuse, Inc., Rosemont, IL (US)

( * ) Notice: Subject to any disclaimer, the term of this patent is extended or adjusted under 35 U.S.C. 154(b) by 492 days.

(21) Appl. No.: 18/131,439

(22) Filed: Apr. 6, 2023

(65) Prior Publication Data

US 2024/0339520 A1     Oct. 10, 2024

(51) Int. Cl.
| | |
|---|---|
| *H10D 12/01* | (2025.01) |
| *H10D 12/00* | (2025.01) |
| *H10D 62/10* | (2025.01) |
| *H10D 62/13* | (2025.01) |
| *H10D 84/01* | (2026.01) |
| *H10D 84/03* | (2025.01) |

(52) U.S. Cl.
CPC ......... *H10D 12/032* (2025.01); *H10D 12/441* (2025.01); *H10D 62/102* (2025.01); *H10D 62/105* (2025.01); *H10D 62/137* (2025.01); *H10D 84/0109* (2025.01); *H10D 84/038* (2025.01)

(58) Field of Classification Search
CPC .. H10D 12/441; H10D 12/032; H10D 12/411; H10D 12/415–418; H10D 12/421; H10D 30/66; H10D 30/662; H10D 30/63; H10D 62/137; H10D 62/105–107; H10D 12/02; H01L 21/185; H01L 21/187; H01L 21/76251
See application file for complete search history.

(56) References Cited

U.S. PATENT DOCUMENTS

| | | | |
|---|---|---|---|
| 4,935,386 A | | 6/1990 | Nakagawa |
| 5,004,705 A | * | 4/1991 | Blackstone ............. H01L 21/74 |
| | | | 438/455 |
| 2011/0306175 A1 | | 12/2011 | Hebert |
| 2013/0122663 A1 | | 5/2013 | Lu |
| 2013/0221403 A1 | | 8/2013 | Lu |
| 2020/0266174 A1 | | 8/2020 | Wisotzki |

FOREIGN PATENT DOCUMENTS

| | | | |
|---|---|---|---|
| KR | 1020210042246 A | | 4/2021 |
| WO | 2016178535 A1 | | 11/2016 |

OTHER PUBLICATIONS

Extended European Search Report for EP 24166672.6, dated Aug. 2, 2024, 12 pages.

* cited by examiner

*Primary Examiner* — Jose R Diaz
(74) *Attorney, Agent, or Firm* — KDW Firm PLLC

(57) ABSTRACT

Methods for making reverse-blocking insulated gate bipolar transistors and associated structures. A first and a second silicon wafer substrates are provided and bonded. One or more separation diffusion regions are formed in the first silicon wafer substrate. One or more front side metal-oxide semiconductor (MOS) structures are formed on a top surface of the first silicon wafer substrate. The second silicon wafer substrate layer is removed. A contact diffusion layer is formed on a bottom surface of the first silicon wafer substrate. A backside metallization layer is formed on a bottom surface of the contact diffusion layer.

26 Claims, 5 Drawing Sheets

100

Front Side — 108

102

N-Type Device Wafer

106

Wafer Bond

104

P-Type Substrate Wafer

Back Side — 110

Front Side 108

N-Type Device Wafer

Wafer Bond

P-Type Substrate Wafer

Back Side 110

Separation Diffusion

112

P- Diffusion

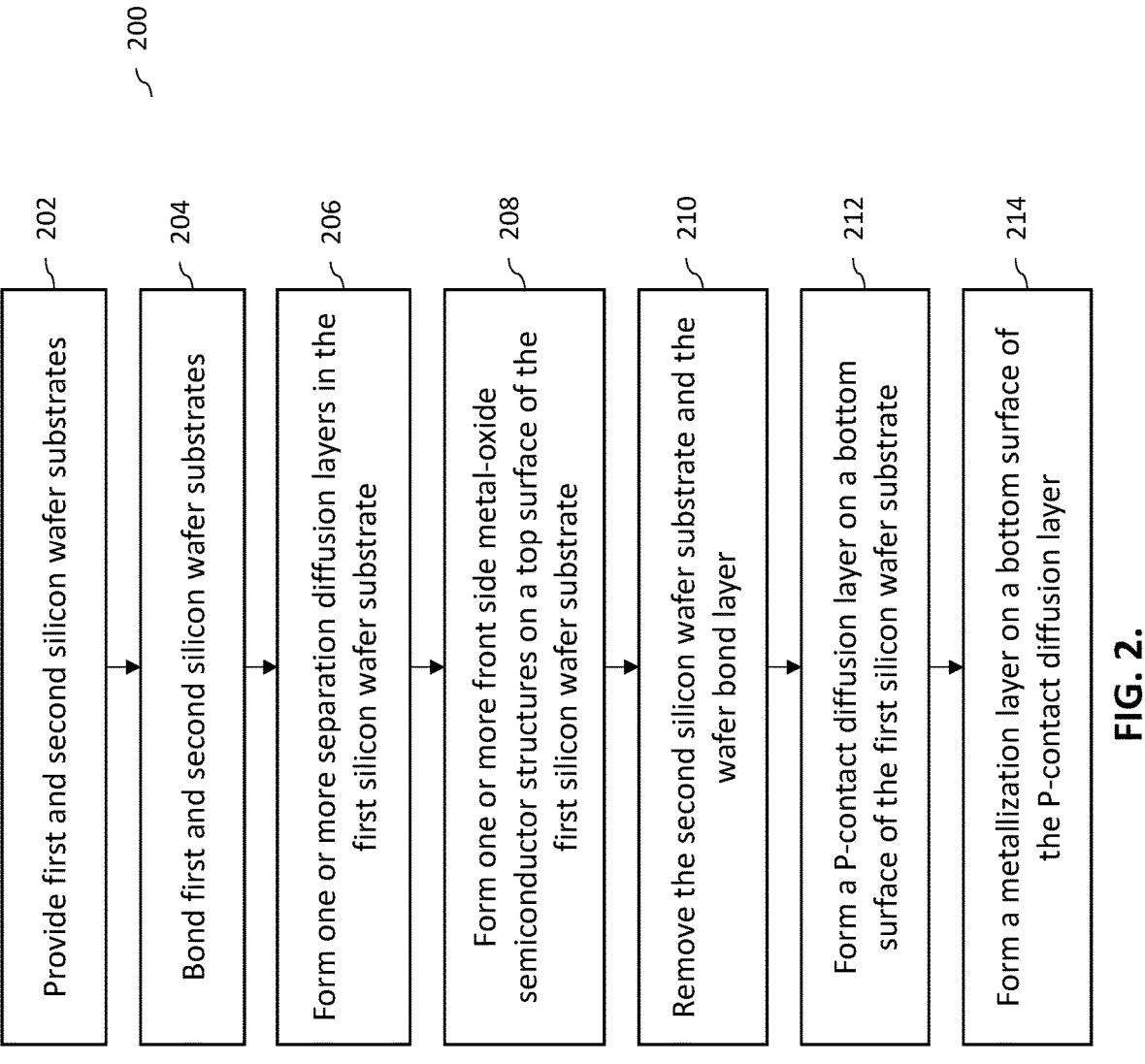

200

202 — Provide first and second silicon wafer substrates

204 — Bond first and second silicon wafer substrates

206 — Form one or more separation diffusion layers in the first silicon wafer substrate 208 — Form one or more front side metal-oxide semiconductor structures on a top surface of the first silicon wafer substrate 210 — Remove the second silicon wafer substrate and the wafer bond layer 212 — Form a P-contact diffusion layer on a bottom surface of the first silicon wafer substrate 214 — Form a metallization layer on a bottom surface of the P-contact diffusion layer

FIG. 2.

REVERSE BLOCKING INSULATED-GATE BIPOLAR TRANSISTOR

TECHNICAL FIELD

This disclosure relates generally to the field of semiconductor devices, and in particular, to manufacturing of semiconductor devices, and even more particularly, to reverse blocking insulated-gate bipolar transistors.

BACKGROUND

An insulated-gate bipolar transistor (IGBT) is a three-terminal power semiconductor device that acts as a highly-efficient fast electronic switch. It includes four alternating layers (P-N-P-N) controlled using a metal-oxide-semiconductor (MOS) gate structure. In most applications, IGBTs are used together with a fast antiparallel diode to allow inductive load current to freewheel. This means that the IGBT collector junction never sees high voltage. However, in some applications (e.g., matrix converters, etc.), it may be necessary to block reverse current from flowing in the IGBT. This can be accomplished using a series-connected diode, but if the IGBT can itself block this current there are savings in terms of lower overall losses, costs and space.

Existing reverse-blocking IGBTs (RB-IGBTs) typically require that their backside collector junction is capable of blocking full-rated voltage of the semiconductor device. This means that the soft punch through (SPT) structure with collector side buffer diffusion cannot be used. Further, while existing RB-IGBTs include a non-punch through (NPT) structure, such structures are not formed by wafer bonding, are too thick, and are difficult to optimize for a predetermined voltage (e.g., 1200V). Moreover, while it may be possible to manufacture RB-IGBTs without a separation diffusion, backside junction termination structures would be required, which are difficult and expensive to realize. Additionally, some existing lower voltage RB-IGBTs have boron separation diffusion, rather than aluminum, however, a drive time for these formation of these structures is very long.

SUMMARY

In some implementations, the current subject matter relates to a method for manufacturing a reverse-blocking insulated-gate bipolar transistor (RB-IGBT). The method may include providing a first and a second silicon wafer substrates, bonding the first and second silicon wafer substrates, forming one or more separation diffusion regions in the first silicon wafer substrate, forming one or more front side metal-oxide semiconductor (MOS) structures on a top surface of the first silicon wafer substrate, removing the second silicon wafer substrate, forming a contact diffusion layer on a bottom surface of the first silicon wafer substrate, and forming a backside metallization layer on a bottom surface of the contact diffusion layer.

In some implementations, the current subject matter may include one or more of the following optional features. The first silicon wafer substrate may be an N-doped silicon wafer substrate. The first silicon wafer substrate may have at least one of the following: a resistivity of approximately 40-120 Ohm-cm, a thickness of approximately 150-300 μm, and any combination thereof.

In some implementations, the second silicon wafer substrate may be a P-doped silicon wafer substrate. The second silicon wafer substrate may have at least one of the following: a resistivity of approximately 0.1-10 Ohm-cm, a thickness of approximately 200-500 μm, and any combination thereof. In some implementations, the method may further include polishing the second silicon wafer substrate. Alternatively, or in addition, the polishing may also include polishing of the first wafer substrate (e.g., one or more of its sides).

In some implementations, the bonding of the first and second silicon wafer substrates may include diffusing one or more particles from the second silicon wafer substrate into the first silicon wafer substrate to form a diffusion region. The diffusion region may be a P-diffusion region. One or more separation diffusion regions may be configured to at least partially merge with the diffusion region to form a junction. Further, forming of the contact diffusion layer may include forming the contact diffusion layer adjacent the diffusion region. The contact diffusion layer may be a P-contact diffusion layer. The contact diffusion layer may be formed between one or more separation diffusion regions. Alternatively, or in addition, in some implementations, forming of the contact diffusion layer may include providing a pre-diffused first silicon wafer substrate.

In some implementations, one or more separation diffusion regions may include at least one of: one or more aluminum separation diffusion regions, one or more boron separation diffusion regions, one or more p-type dopant separation diffusion regions, and/or any combination thereof.

In some implementations, one or more MOS structures may be formed between the one or more separation diffusion regions on the top surface of the first silicon wafer substrate.

In some implementations, removing may include removing the wafer bond layer formed by the bonding. Removing may include at least one of the following: grinding, etching, and any combination thereof.

In some implementations, the backside metallization layer may include at least one of the following: an aluminum backside metallization layer, a titanium backside metallization layer, a nickel backside metallization layer, a silver backside metallization layer, a gold metallization layer, a metallic backside metallization layer, a metal oxide backside metallization layer, and any combination thereof.

In some implementations, the current subject matter relates to a semiconductor device, such as, for example, an RB-IGBT. The semiconductor device may include a first silicon wafer substrate having a diffusion region resulting from the first silicon wafer substrate being bonded to a second silicon wafer substrate. The second silicon wafer substrate may be removed. One or more dopant particles from the second silicon wafer substrate may be configured to diffuse into the first silicon wafer substrate. The device may also include one or more separation diffusion regions formed in the first silicon wafer substrate, one or more front side metal-oxide semiconductor (MOS) structures on a top surface of the first silicon wafer substrate, a contact diffusion layer formed on a bottom surface of the first silicon wafer substrate, and a backside metallization layer formed on a bottom surface of the contact diffusion layer.

In some implementations, the current subject matter may include one or more of the following optional features. In the semiconductor device, the first silicon wafer substrate may be an N-doped silicon wafer substrate. The diffusion region may be a P-diffusion region. The contact diffusion layer may be formed adjacent the diffusion region. The contact diffusion layer may be a P-contact diffusion layer. The contact diffusion layer may be formed between one or more separation diffusion regions. Alternatively, or in addition, the contact diffusion layer may be a pre-diffused layer. In some implementations, one or more MOS structures may be formed between the one or more separation diffusion regions on the top surface of the first silicon wafer substrate. The backside metallization layer may include at least one of the following: an aluminum backside metallization layer, a titanium backside metallization layer, a nickel backside metallization layer, a silver backside metallization layer, a gold backside metallization layer, a metallic backside metallization layer, a metal oxide backside metallization layer, and any combination thereof.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings, FIG. 2 illustrates an example method for manufacturing semiconductor device, according to some implementations of the current subject matter.

Figure 1A:
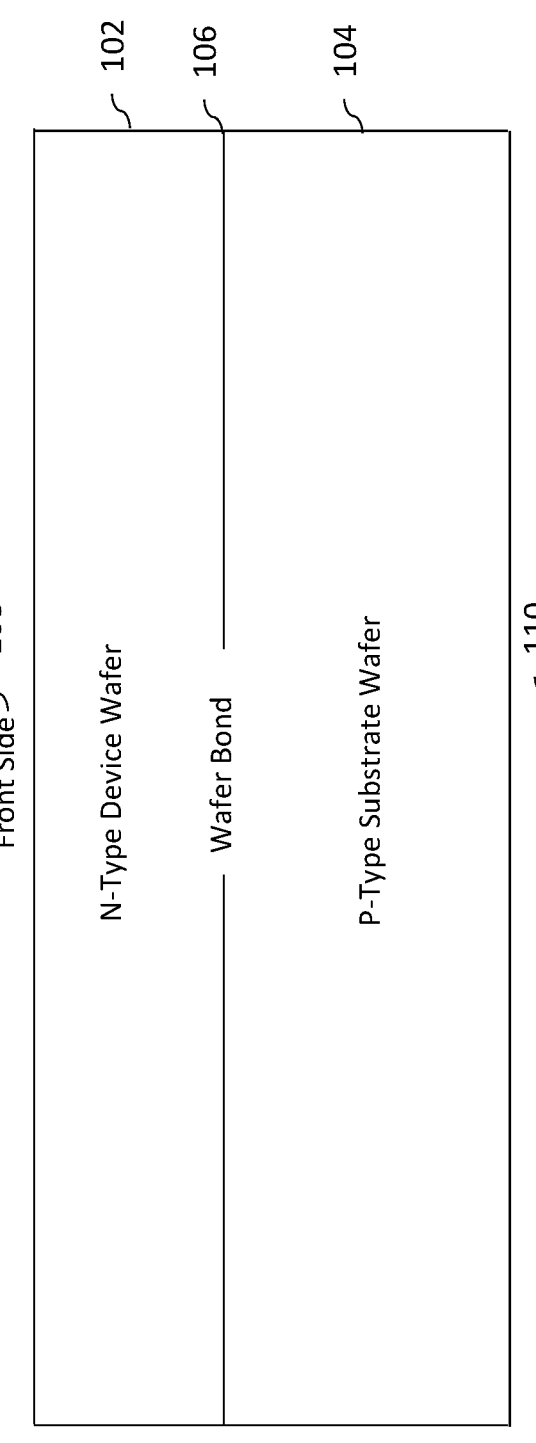
FIGS. 1a-d illustrate an exemplary method for manufacturing a semiconductor device, according to some implementations of the current subject matter.

The drawings are not necessarily to scale. The drawings are merely representations, not intended to portray specific parameters of the disclosure. The drawings are intended to depict exemplary implementations of the current subject matter, and therefore, are not to be considered as limiting in scope. In the drawings, like numbering represents like elements.

Further, certain elements in some of the figures may be omitted, and/or illustrated not-to-scale, for illustrative clarity. Cross-sectional views may be in the form of "slices", and/or "near-sighted" cross-sectional views, omitting certain background lines otherwise visible in a "true" cross-sectional view, for illustrative clarity. Additionally, for clarity, some reference numbers may be omitted in certain drawings.

DETAILED DESCRIPTION

Various approaches in accordance with the present disclosure will now be described more fully hereinafter with reference to the accompanying drawings, where implementations of a system and method are shown. The devices, system(s), component(s), etc., may be embodied in many different forms and are not to be construed as being limited to the example implementations set forth herein. Instead, these example implementations are provided so this disclosure will be thorough and complete, and will fully convey the scope of the current subject matter to those skilled in the art.

To address these and potentially other deficiencies of currently available solutions, one or more implementations of the current subject matter relate to methods, systems, articles of manufacture, and the like that can, among other possible advantages, provide systems and methods for manufacturing semiconductor devices, and in particular, for manufacturing reverse blocking insulated-gate bipolar transistors (IGBTs).

As stated above, IGBT includes four alternating P, N layers controlled by MOS gate structure. An IGBT cell has a structure that is similar to an n-channel vertical-construction power MOSFET, however, the n+ drain is replaced with a p+ collector layer, thereby forming a vertical PNP bipolar junction transistor. The p+ region creates a cascade connection of a PNP bipolar junction transistor with the surface n-channel MOSFET. The IGBT structure is also similar to a MOS-gate thyristor, however, the thyristor action is suppressed, and only the transistor action is permitted in the entire device operation range. The IGBT is designed to synthesize complex waveforms with pulse-width modulation and low-pass filters and can be used in switching amplifiers (e.g., sound systems, industrial control systems, etc.).

A reverse blocking IGBT (RB-IGBT) is a bidirectional switch, which a specific IGBT capable of sustaining voltage of both directions. In particular, RB-IGBT is an IGBT in non-punch through (NPT) technology having an extra isolation p+ region, which enables sustaining reverse voltage without degradation of the reverse leakage current performance. Forward ON-state voltage and conduction losses are lower than in the IGBT and external blocking diode combined bidirectional switch structure. The RB-IGBT blocking diode is optimized for low ON-state voltage. Moreover, reverse recovery current of the internal diode and turn-ON losses of the IGBT are greater in the 1200 V range.

In some scenarios, 1200V class of RB-IGBTs can have an optimum silicon thickness of about 170 μm. This is the minimum thickness that can reliably block 1200V with the NPT structure. Large diameter 170 μm thick wafers are too fragile to be fully processed in a standard wafer fabrication processes. Standard low voltage (1200V) soft-punch-through (SPT) IGBTs use some of the following manufacturing solutions. One of the solutions involves use of epitaxial layers with the required characteristics for depositing on a wafer substrate. The substrate can be thinned or removed, by grind and etching, near to the end of the process. However, wafers with a 170 μm epitaxial layer are too expensive to provide a practical solution for the 1200V RB-IGBT. In practice, the RB-IGBT epitaxial layer may need to be thicker to allow for up diffusion of the collector during the separation diffusion.

Another manufacturing solution includes processing wafers of standard processing thickness with a required N-drift resistivity to near completion, and then thinning them (e.g., using grinding and/or etching) to an optimum thickness. A collector layer can then be implanted into the wafer backside and activated. However, this thin implanted collector layer is not suitable for supporting a high reverse voltage.

In RB-IGBT, the process can begin with a N-type wafer having a deep diffused P+ (e.g., Boron) layer, where the tail of the diffusion can form the collector layer after grinding. It should be noted that existing SPT IGBT can start using a wafer with a deep N+ diffusion, where the tail of the diffusion can form a buffer after grinding. However, this approach lacks flexibility and tail would be very lightly doped. This light collector layer may need to be deep to block full voltage leading to high losses and control of collector layer injection efficiency may be poor.

In some implementations, to resolve the above drawbacks of conventional processes, the current subject matter relates to a wafer bonding process for manufacturing an RB-IGBT. The process may begin with two wafer substrates having different dopant properties. For example, one wafer substrate may be a P-type wafer, which may be removed at later stage in the process. Another wafer substrate may be an N-type wafer. The wafers are then bonded together. The bonding may be accomplished in a desired manner. As discussed herein, the final RB-IGBT device may be accomplished as a result of the bonding of these two wafer substrates.

In some example, non-limiting implementations, the P-type wafer substrate may have a predetermined thickness to provide a suitable mechanical support during standard front side processing (e.g., create a MOS structure, etc.). For instance, it may have a boron concentration, which may be used as a suitable diffusion source for the RB-IGBT collector layer. The collector layer diffusion may occur during the aluminum separation diffusion thermal cycle.

The N-type wafer substrate may have a predetermined resistivity, which may be selected for the RG-IGBT drift layer. Subsequent to the bonding of the two wafers, the thickness of the resulting layer may be adjusted by grinding and/or etching. In some example, non-limiting implementations, a final N-type drift layer may have an approximately 170 μm thickness for a 1200V RB-IGBT, which may account for an upward diffusion of the collector layer. As can be understood, any other thickness of the layers may be used. Moreover, the current subject matter process is applicable to manufacturing any other types of semiconductor devices.

In some implementations, an aluminum separation diffusion may be used to bring a collector junction up to a top surface for termination (e.g., which may be accomplished in any desired manner, such as, using guard rings, etc.). During separation, drive step boron may also diffuse upwards from the substrate to form the collector layer. The final collector layer profile may be controlled by selecting substrate doping concentration and/or final target thickness of the semiconductor device.

Following the separation diffusion, the front side of the wafer may be polished to a standard that may be compatible with MOS processing. Standard front side IGBT processing may also follow. When complete, the substrate silicon may be completely removed by grinding (e.g., TAIKO, full face, and/or any other type of processes) and/or etching past the wafer bond and into the collector diffusion. The process may be completed with backside metallization. A backside contact implant and/or anneal may be added before metallization to improve the collector contact and injection efficiency.

FIGS. 1a-d illustrate an exemplary method 100 for manufacturing a semiconductor device (shown in 2-dimensional views), according to some implementations of the current subject matter. The method 100 may be used to manufacture an exemplary insulated-gate bipolar transistor (IGBT), and in particular, reverse blocking IGBT (RB-IGBT). As can be understood, any other type of semiconductor device may be manufactured using method 100.

Referring to FIG. 1a, a first wafer substrate 102 and a second wafer substrate 104 may be provided. The first wafer substrate 102 may be an N-type device silicon wafer substrate. The second wafer substrate 104 may be a P-type device silicon wafer substrate. A top surface of the first wafer substrate 102 may correspond to a front side 108 of a semiconductor device to be formed by the method 100. A bottom surface of the second wafer substrate 104 may correspond to a back side 110, which may be removed at one of the stages during the method 100.

The first wafer substrate 102 may be bonded to the second wafer substrate 104 using a wafer bond 106. The bonding between the first wafer substrate 102 and the second wafer substrate 104 may be accomplished using any desired methods.

In some example, non-limiting implementations, for the purposes of manufacturing a 1200V RB-IGBT, the first wafer substrate 102 (e.g., device wafer) can be doped with phosphorus resistivity dopant, with resistivity being in a range of approximately 40-120 Ohm-cm (e.g., approximately 60 Ohm-cm). The first wafer substrate 102 may have a thickness in a range of approximately 150-300 μm (e.g., approximately 220 μm). Moreover, the first wafer substrate 102 may be polished on one side for the purposes of wafer bonding. Resistivity of the first wafer substrate 102 may be configured to support approximately 1200V in non-punch through mode.

The second wafer substrate 104 (e.g., wafer substrate to be removed during a final grinding stage) can be doped with boron resistivity dopant, with resistivity being in a range of approximately 0.1-10 Ohm-cm (e.g., approximately 1 Ohm-cm). The second wafer substrate 104 may have a thickness in a range of approximately 200-500 μm (e.g., approximately 300 μm). The second wafer substrate 104 may also be polished on one side for wafer bonding. Such polishing may be configured to remove approximately 10-20 μm. Resistivity of the second wafer substrate 104 may be configured to determine one or more properties of the collector, e.g., concentration, depth, etc., which may be derived from the dopant (e.g., boron) that diffuses into the substrate 102 during the separation diffusion thermal cycle.

Bonding of the two wafer substrates 102, 104 may be configured to result in a bonded wafer having a thickness in range of approximately 300-650 μm (e.g., approximately 500 μm, which may depend on wafer diameter and wafer fabrication handling capability). As part of the wafer bonding process, both wafer substrates 102, 104 may have polished sides facing each other for the purpose of bonding. The wafer substrates 102, 104 may be cleaned and brought into contact under water for bonding. The bonded wafer may also be annealed to improve strength of the wafer bond 106.

Figure 1B:
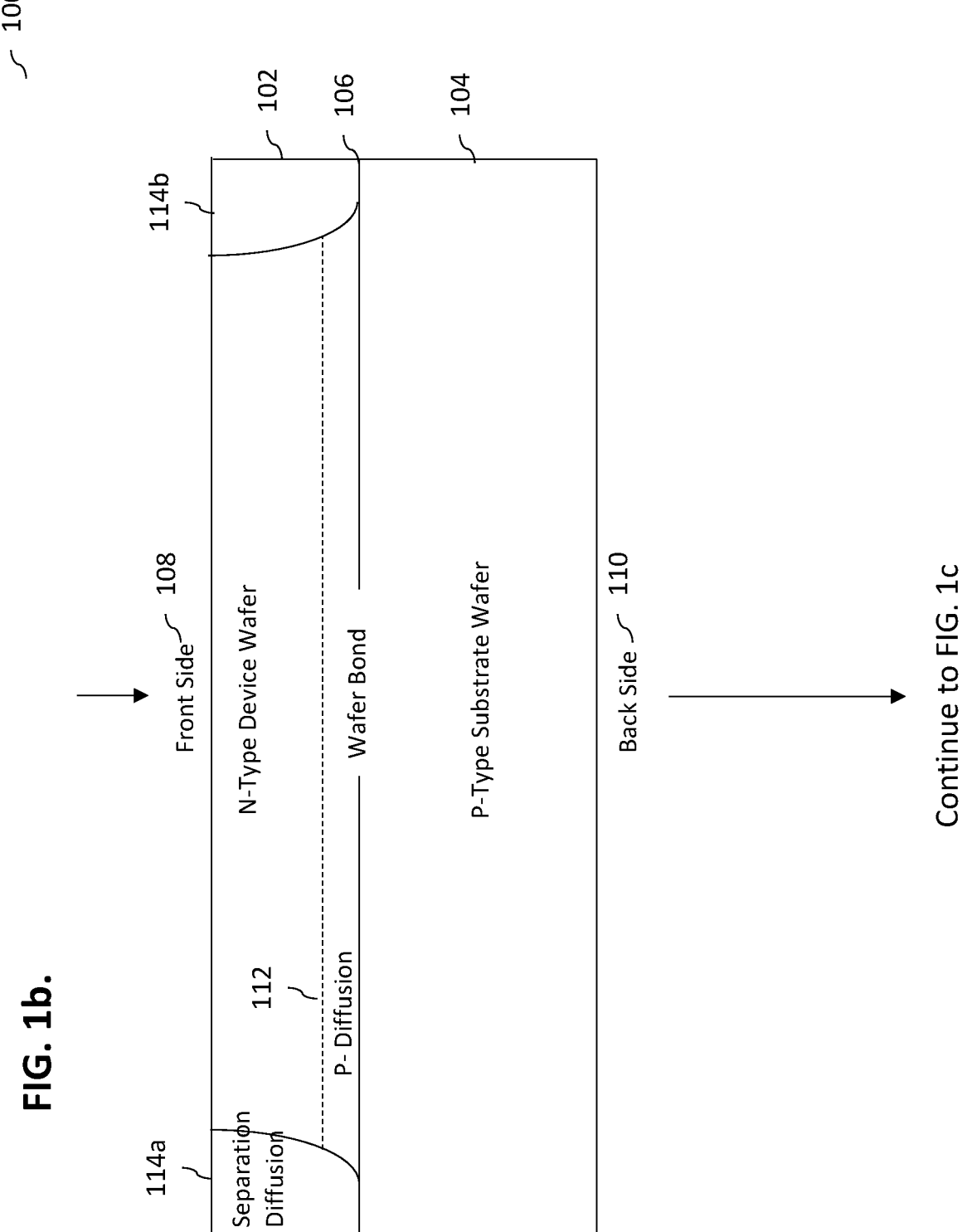

Referring to FIG. 1b, collector or P-diffusion layer 112 and separation diffusion regions 114(a, b) may be formed. In some example, implementations, the separation diffusion regions 114 may be configured to merge with the collector diffusion layer 112 to form and/or bring an unbroken junction to the top surface, where the junction may be configured to have a suitable concentration capable of supporting a predetermined voltage (e.g., 1200V). Processes involved in forming of separation diffusion and/or P-diffusion regions/layers may be defined, affected, and/or configured using one or more factors (e.g., drive time, temperature, etc.), which, in turn, may be used to determine various aspects of the formed regions/layers and/or portions thereof, e.g., depth of the P-diffusion layer 112. The P-diffusion layer 112 may be configured to form upon diffusion of boron particles from the second wafer substrate 104 into the first wafer substrate 102. The diffusion regions 114 and/or the collector diffusion layer 112 may be formed simultaneously and/or substantially simultaneously. Alternatively, or in addition, the formation of regions 114 and layer 112 may be accomplished in a predetermined order. Further, one or more profile parameters (e.g., depth, concentration, etc.) of the collector diffusion layer 112 may be determined and/or controlled by the resistivity of the wafer substrate 104 and/or how much of the wafer substrate 104 is ground and/or etched during the method 100. Alternatively, or in addition, the first wafer substrate 102 may be pre-diffused, whereby the tail end of the substrate 102 may be configured to form a collector. In this case, the second wafer substrate (and the second wafer substrate associated processes) might not be necessary (e.g., it may be omitted from the process), while other processes associated with the first wafer substrate (e.g., formation of separation diffusion regions, backside grinding, etc.) may be performed, as discussed herein. The p-type diffusion in the pre-diffused first wafer substrate 102 may have sufficient depth to provide a robust overall thickness.

In some example, non-limiting implementations, the diffusion regions 114 may be formed by evaporating aluminum onto N-type surface (i.e., first wafer substrate 102) and patterning it using photolithography, where aluminum is diffused in select areas. Alternatively, or in addition, separation diffusion regions may be formed using boron and/or any other p-type dopants. For instance, such separation diffusion regions may be useful in lower voltage applications. In some example, non-limiting implementations, the aluminum diffusion may be configured to extend to meet the dopant (e.g., boron) from the second wafer substrate 104 being diffused into the first wafer substrate 102, thereby bringing the back side 110 (corresponding to a collector layer of the IGBT) junction to the top surface. The aluminum diffusion may also be configured to fully enclose an active portion of the IGBT device (since FIGS. 1*a-d* illustrate 2-dimensional views of the semiconductor device, it should be noted that the diffusion regions 114 form a single diffusion region that encloses/encircles the IGBT device). In some example, non-limiting implementations, the aluminum diffusion may be accomplished using ion implantation and/or thermal drive. The aluminum diffusion may be accomplished using a temperature range of approximately 1200° C.-1350° C. (e.g., approximately 1250° C.) over a predetermined period of time, such as, for example, approximately 60 hours (for 1250° C.). As can be understood, any other temperatures and/or periods of time are possible.

By way of a non-limiting example, the diffusion of boron into first wafer substrate 102 may be approximately 20 μm deep junction, which may correspond to the thickness of the P-diffusion layer 112. This diffusion may be configured to form a collector layer diffusion of the RB-IGBT device, thereby resulting in a blocking junction being characterized by appropriate concentration, thickness, and/or quality parameters capable of blocking voltages of greater than approximately 1200V with low defectivity. In some example, non-limiting implementations, diffusion layer 112 may also be configured to be suitable for IGBT collector, and/or suitable hole injection efficiency, which may be adjusted for desired performance and/or end-user applications.

Figure 1C:
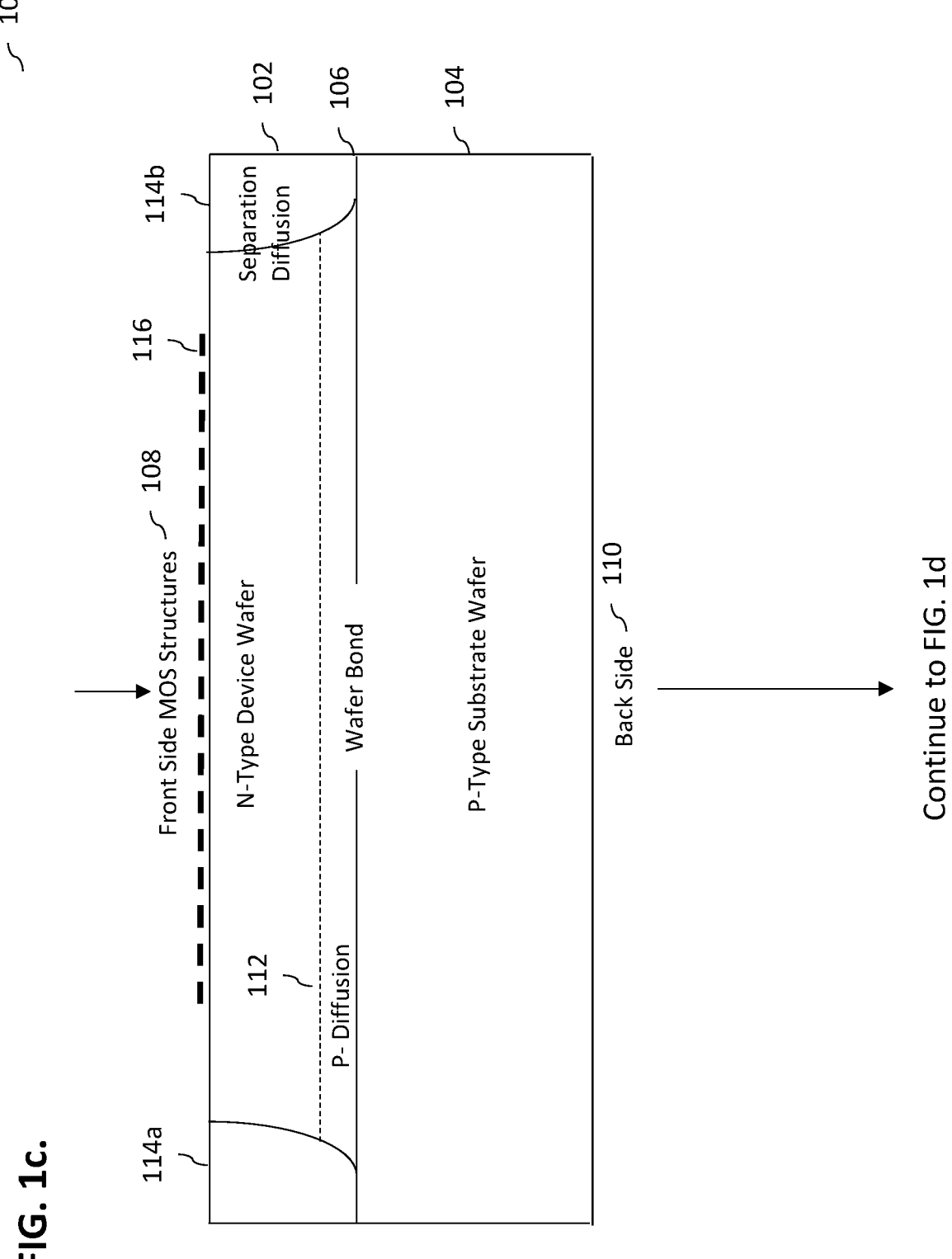

Referring to FIG. 1*c*, one or more front side MOS structures 116 may be added to the front side 108 of the semiconductor device being produced by the method 100. The structures may be added subsequent to polishing of the front side 108.

In some example, non-limiting implementations, residual aluminum (resulting from the separation diffusion region(s) 114 creation) may be etched off, which may be followed by wafer polishing to produce a suitable top surface for any MOS and/or termination processing. For instance, such etching and/or water polishing may be configured to remove approximately 10 μm of material. Further, MOS processing may involve addition of one or more trench(es), planar gate(s), and/or performing any other standard MOS processing. In some example, non-limiting implementations, the MOS processing may include gate and/or emitter contact mentalizations, which may be suitable for wire bond connections, and/or any other operations.

Additionally, junction termination structures may be positioned between any active MOS features that have been added and the diffusion regions 114 (e.g., guard rings, passivation layers). The junction termination structures may be used to support blocking voltage in forward and/or reverse directions.

Figure 1D:
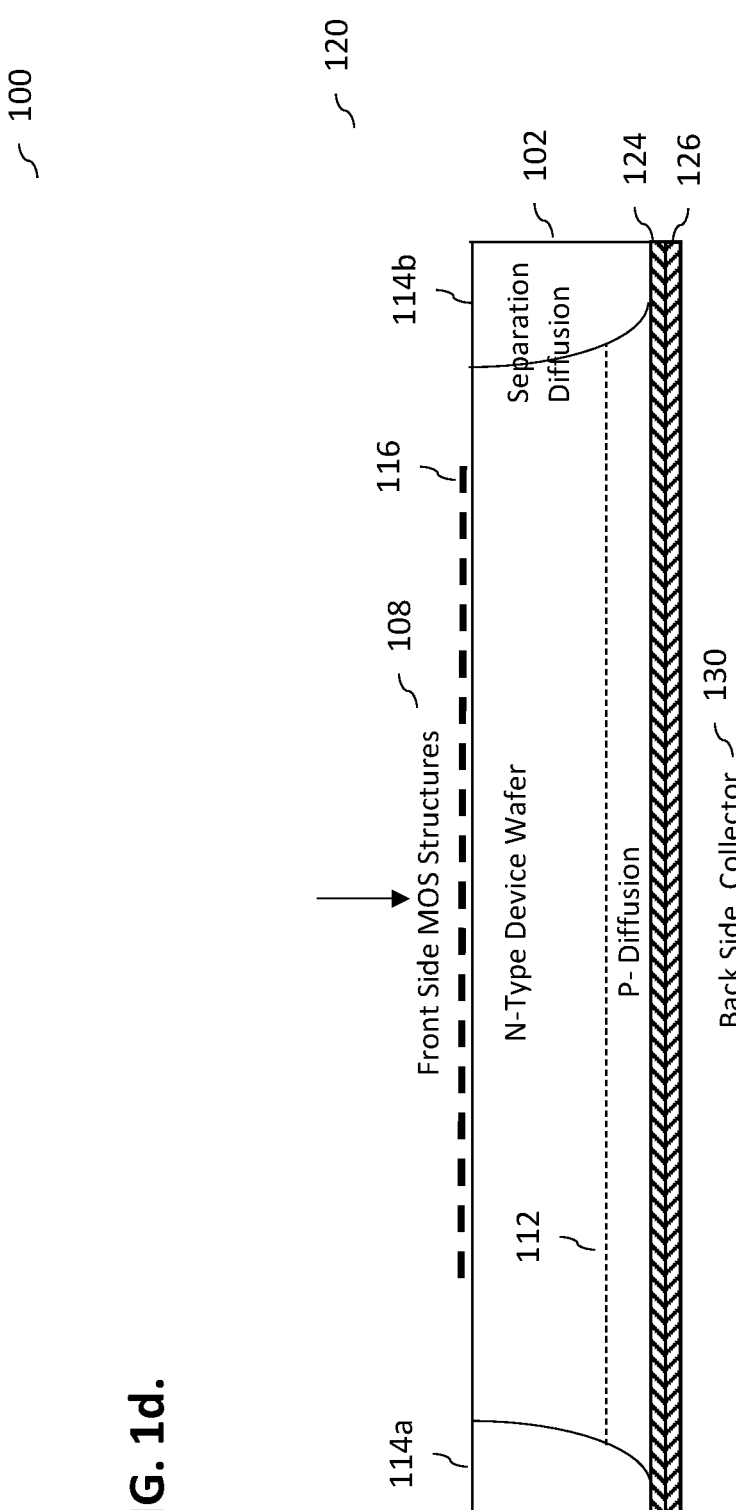

Referring to FIG. 1*d*, backside processing may be performed as some of the final stages of the method 100 in producing a semiconductor device 120 (e.g., RB-IGBT). As part of the processing shown in FIG. 1*d*, the second wafer substrate 104 may be removed. The removal of the second wafer substrate 104 may be accomplished by grinding. In some example, non-limiting implementations, the removal of the second wafer substrate 104 may be a complete removal of the wafer substrate 104 include any bonding (e.g., wafer bond layer 106) between the first wafer substrate 102 and the second wafer substrate 104. The grinding of the second wafer substrate 104 may also include removal of any silicon crystal damage that may be associated with creation of the wafer bond layer 106 (as shown in FIG. 1*a*).

The grinding of the second wafer substrate 104 may also be followed by a backside etching process. This process may also remove any remaining damage that may have resulted from the grinding of the second wafer substrate 104. In some example, non-limiting implementations, the etching may involve removal of approximately 10-15 μm of material. Once removed, the thickness of the remaining device may be in a range of approximately 150-300 μm (e.g., approximately 190 μm).

The above processes may be followed by creation of a P+ contact layer 124 by performing backside contact implantation and annealing. This may be advantageous in improving contact with backside metallization layer 126 and efficiency of the backside collector 130. The metallization layer 126 may then be added to the back of the contact layer 124. Metallization layer 126 may be used for solder contact (e.g., with a printed circuit board, electronic components, etc.). The metallization layer 126 may be manufactured from at least one of the following: aluminum, titanium, nickel, silver, gold, and/or any other metal, and/or metallic components, and/or any combination thereof. The method 100 may be completed with various standard semiconductor device manufacturing processes, e.g., wafer probing, dicing, assembly, soldering to a base of a semiconductor package, etc.

FIG. 2 illustrates an example method 200 for manufacturing semiconductor device, according to some implementations of the current subject matter. The method 200 may be used to manufacture a semiconductor device 120 (as shown in FIG. 1*d*), for example, an insulated-gate bipolar transistor semiconductor device, and more particularly, a reverse-blocking insulated-gate bipolar transistor semiconductor device.

At 202, a first and a second silicon wafer substrates may be provided. The first silicon wafer substrate (e.g., substrate 102) may be an N-doped silicon wafer substrate. The second silicon wafer substrate (e.g., substrate 104) may be a P-doped silicon wafer substrate.

At 204, the first and second silicon wafer substrates may be bonded. A wafer bond (e.g., wafer bond layer 106) may be created.

At 206, one or more separation diffusion regions (e.g., regions 114*a* and 114*b*) may be formed in the first silicon wafer substrate. Moreover, as a result of the bonding of the first and second silicon wafer layers, a P-diffusion layer (e.g., layer 112) may be formed in the first silicon wafer layer. As stated above, the regions 114 may merge with the layer 112 to form and/or bring an unbroken junction to the top surface. The junction may have a suitable concentration capable of supporting a predetermined voltage (e.g., 1200V). As stated above, one or more factors may be used to configure various aspects of the formed regions/layers and/or portions thereof. For example, depth of the P-diffusion layer 112 may be configurable based on, for instance, drive time, temperature, and/or any other factors and/or any combination thereof. As discussed herein, the formation of regions 114 and layer 112 may be accomplished simultaneously, substantially simultaneously, in a predetermined order, and/or in any other fashion. The layer 112's profile parameter(s), such as, depth, concentration, etc. may depend on the resistivity of the wafer substrate 104, grinding/etching of the wafer substrate 104, and/or any other factors. Alternatively, or in addition, a pre-diffused first wafer substrate 102 may be used, whose tail end may form a collector, and as stated above, the second wafer substrate and associated processes may be omitted, while other operations, e.g., formation of separation diffusion regions, backside grinding, etc. may be performed.

At 208, one or more front side metal-oxide semiconductor (MOS) structures may be formed on a top surface of the first silicon wafer substrate. The MOS structures may be formed between and/or may be enclosed (on the top surface of the first silicon wafer substrate) by the separation diffusion regions.

At 210, the second silicon wafer substrate layer, along with the wafer bond layer, may be removed. The removal of the second silicon wafer substrate layer and/or the wafer bond layer may be accomplished using grinding, etching, and/or any other suitable processes and/or any combination thereof.

At 212, a P-contact diffusion layer may be formed on a bottom surface of the first silicon wafer substrate. The P-contact diffusion layer (e.g., layer 124) may be formed adjacent the P-diffusion layer (e.g., layer 112). The P-contact diffusion layer may be configured to span between the two separation diffusion layers. As stated above, it may be configured to improve contact with a subsequently formed backside metallization layer.

At 214, a backside metallization layer (e.g., layer 126) may be formed on a bottom surface of the P-contact diffusion layer, thereby forming the semiconductor device. This allows the semiconductor device to be coupled to one or more electronic components, printed circuit boards, semiconductor package, etc.

The components and features of the devices described above may be implemented using any combination of discrete circuitry, application specific integrated circuits (ASICs), logic gates and/or single chip architectures. Further, the features of the devices may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It will be appreciated that the exemplary devices shown in the block diagrams described above may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" (or derivatives thereof) in various places in the specification are not necessarily all referring to the same embodiment. Moreover, unless otherwise noted the features described above are recognized to be usable together in any combination. Thus, any features discussed separately may be employed in combination with each other unless it is noted that the features are incompatible with each other.

It is emphasized that the abstract of the disclosure is provided to allow a reader to quickly ascertain the nature of the technical disclosure. It is submitted with the understanding that it will not be used to interpret or limit the scope or meaning of the claims. In addition, in the foregoing detailed description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the detailed description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects. Further, the use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner and may generally include any set of one or more limitations as variously disclosed or otherwise demonstrated herein.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Further, identification references (e.g., primary, secondary, first, second, third, fourth, etc.) are not intended to connote importance or priority but are used to distinguish one feature from another. The drawings are for purposes of illustration only and the dimensions, positions, order and relative sizes reflected in the drawings attached hereto may vary.

The present disclosure is not to be limited in scope by the specific implementations described herein. Indeed, other various implementations of and modifications to the present disclosure, in addition to those described herein, will be apparent to those of ordinary skill in the art from the foregoing description and accompanying drawings. Thus, such other implementations and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing a first and a second silicon wafer substrates;
bonding the first and second silicon wafer substrates, wherein the bonding the first and second silicon wafer substrates includes diffusing one or more particles from the second silicon wafer substrate into the first silicon wafer substrate to form a diffusion region;
forming one or more separation diffusion regions in the first silicon wafer substrate;
forming one or more front side metal-oxide semiconductor (MOS) structures on a top surface of the first silicon wafer substrate;
removing the second silicon wafer substrate;
forming a contact diffusion layer on a bottom surface of the first silicon wafer substrate; and
forming a backside metallization layer on a bottom surface of the contact diffusion layer.

2. The method according to claim 1, wherein the first silicon wafer substrate is an N-doped silicon wafer substrate.

3. The method according to claim 2, wherein the first silicon wafer substrate has at least one of the following: a resistivity of approximately 40-120 Ohm-cm, a thickness of approximately 150-300 μm, and any combination thereof.

4. The method according to claim 1, wherein the second silicon wafer substrate is a P-doped silicon wafer substrate.

5. The method according to claim 4, wherein the second silicon wafer substrate has at least one of the following: a resistivity of approximately 0.1-10 Ohm-cm, a thickness of approximately 200-500 μm, and any combination thereof.

6. The method according to claim 4, further comprising polishing the second silicon wafer substrate.

7. The method according to claim 1, wherein the diffusion region is a P-diffusion region.

8. The method according to claim 1, wherein the one or more separation diffusion regions are configured to at least partially merge with the diffusion region to form a junction.

9. The method according to claim 1, wherein forming the contact diffusion layer includes forming the contact diffusion layer adjacent to the diffusion region.

10. The method according to claim 9, wherein the contact diffusion layer is a P-contact diffusion layer.

11. The method according to claim 9, wherein the diffusion region is formed between the one or more separation diffusion regions.

12. The method according to claim 9, wherein forming the contact diffusion layer includes providing a pre-diffused first silicon wafer substrate.

13. The method according to claim 1, wherein the one or more separation diffusion regions include at least one of: one or more aluminum separation diffusion regions, one or more boron separation diffusion regions, one or more p-type dopant separation diffusion regions, and any combination thereof.

14. The method according to claim 1, wherein the one or more MOS structures are formed between the one or more separation diffusion regions on the top surface of the first silicon wafer substrate.

15. The method according to claim 1, wherein the removing includes removing a wafer bond layer formed by the bonding.

16. The method according to claim 1, wherein the removing includes at least one of the following: grinding, etching, and any combination thereof.

17. The method according to claim 1, wherein the backside metallization layer includes at least one of the following: an aluminum backside metallization layer, a titanium backside metallization layer, a nickel backside metallization layer, a silver backside metallization layer, a gold metallization layer, a metallic backside metallization layer, a metal oxide backside metallization layer, and any combination thereof.

18. A semiconductor device, comprising:
a first silicon wafer substrate having a diffusion region, the diffusion region is formed by
bonding the first silicon wafer substrate to a second silicon wafer substrate, wherein the bonding of the first and second silicon wafer substrates includes diffusing one or more particles from the second silicon wafer substrate into the first silicon wafer substrate to form the diffusion region,
wherein the second silicon wafer substrate is removed;
one or more separation diffusion regions formed in the first silicon wafer substrate;
one or more front side metal-oxide semiconductor (MOS) structures on a top surface of the first silicon wafer substrate;
a contact diffusion layer formed on a bottom surface of the first silicon wafer substrate; and
a backside metallization layer formed on a bottom surface of the contact diffusion layer.

19. The semiconductor device according to claim 18, wherein the first silicon wafer substrate is an N-doped silicon wafer substrate.

20. The semiconductor device according to claim 18, wherein the diffusion region is a P-diffusion region.

21. The semiconductor device according to claim 18, wherein the contact diffusion layer is formed adjacent the diffusion region.

22. The semiconductor device according to claim 21, wherein the contact diffusion layer is a P-contact diffusion layer.

23. The semiconductor device according to claim 21, wherein the contact diffusion layer is formed between the one or more separation diffusion regions.

24. The semiconductor device according to claim 18, wherein the contact diffusion layer is a pre-diffused layer.

25. The semiconductor device according to claim 18, wherein the one or more MOS structures are formed between the one or more separation diffusion regions on the top surface of the first silicon wafer substrate.

26. The semiconductor device according to claim 18, wherein the backside metallization layer includes at least one of the following: an aluminum backside metallization layer, a titanium backside metallization layer, a nickel backside metallization layer, a silver backside metallization layer, a gold backside metallization layer, a metallic backside metallization layer, a metal oxide backside metallization layer, and any combination thereof.

14

\* \* \* \* \*